United States Patent
Wu et al.

(10) Patent No.: US 9,545,022 B2
(45) Date of Patent: Jan. 10, 2017

(54) LEAD SHEATH ASSEMBLY AND MOTOR COMPRISING THE SAME

(71) Applicant: ZHONGSHAN BROAD-OCEAN MOTOR CO., LTD., Zhongshan (CN)

(72) Inventors: Yonghua Wu, Zhongshan (CN); Yunsheng Chen, Zhongshan (CN); Qixiang Xiang, Zhongshan (CN)

(73) Assignee: ZHONGSHAN BROAD-OCEAN MOTOR CO., LTD., Zhongshan (CN)

( * ) Notice: Subject to any disclaimer, the term of this patent is extended or adjusted under 35 U.S.C. 154(b) by 275 days.

(21) Appl. No.: 14/326,447

(22) Filed: Jul. 8, 2014

(65) Prior Publication Data

US 2015/0054364 A1 Feb. 26, 2015

(30) Foreign Application Priority Data

Aug. 21, 2013 (CN) ................... 2013 2 0514393 U

(51) Int. Cl.
*H02K 5/02* (2006.01)
*H05K 5/02* (2006.01)
*H02K 11/00* (2016.01)
*H02K 5/22* (2006.01)

(52) U.S. Cl.
CPC ............ *H05K 5/0247* (2013.01); *H02K 5/225* (2013.01); *H02K 11/0094* (2013.01); *H02K 11/28* (2016.01); *H02K 2213/09* (2013.01)

(58) Field of Classification Search
CPC ...... H02K 5/22; H02K 5/225; H02K 11/0094; H02K 11/28; H05K 5/0247

USPC ............................................. 310/71
See application file for complete search history.

(56) References Cited

U.S. PATENT DOCUMENTS

| | | | | |
|---|---|---|---|---|
| 4,656,378 A * | 4/1987 | Atherton | .............. | H01R 4/2462 310/68 C |
| 4,894,571 A * | 1/1990 | Hildebrandt | ........... | H02K 11/25 310/68 C |
| 5,777,409 A * | 7/1998 | Keck | ....................... | H02K 5/225 310/71 |
| 5,782,652 A * | 7/1998 | Feher | .................... | H01R 4/2462 310/71 |
| 7,109,618 B2 * | 9/2006 | Cha | ........................ | H01R 4/185 29/596 |
| 2006/0160430 A1* | 7/2006 | Siddiqi | ................ | H01R 13/523 439/700 |
| 2006/0250754 A1* | 11/2006 | Schlosser | ............ | F04D 13/0693 361/600 |
| 2008/0070433 A1* | 3/2008 | Zeigler | ............... | G01L 19/0084 439/206 |
| 2011/0097920 A1* | 4/2011 | Amit | ..................... | B60L 11/005 439/304 |

* cited by examiner

*Primary Examiner* — Naishadh Desai
(74) *Attorney, Agent, or Firm* — Matthias Scholl, PC; Matthias Scholl

(57) ABSTRACT

A lead sheath assembly, including a lead sheath; a plurality of external wires; a jumper box; and a connecting terminal. The lead sheath includes a cavity. The jumper box includes: a plurality of through holes, a front end including a front interface, and a rear end including a rear interface. The external wires are mounted on the lead sheath. The jumper box is disposed in the cavity. The connecting terminal is disposed in the through hole.

3 Claims, 10 Drawing Sheets

LEAD SHEATH ASSEMBLY AND MOTOR COMPRISING THE SAME

CROSS-REFERENCE TO RELATED APPLICATIONS

Pursuant to 35 U.S.C. §119 and the Paris Conversion Treaty, this application claims the benefit of Chinese Patent Application No. 201320514393.9 filed Aug. 21, 2013, the contents of which are incorporated herein by reference. Inquiries from the public to applicants or assignees concerning this document or the related applications should be directed to: Matthias Scholl P. C., Attn.: Dr. Matthias Scholl Esq., 245 First Street, 18$^{th}$ Floor, Cambridge, Mass. 02142.

BACKGROUND OF THE INVENTION

Field of the Invention

The invention relates to a lead sheath assembly and a motor comprising the same.

Description of the Related Art

A typical lead sheath assembly for a motor includes a lead sheath and a connector. The connector is mounted in a cavity of the connector. One end of the connector is connected to a control board arranged inside the motor, and the other end of the connector is connected to an external application via a leading wire. However, the assembly has the following problems: 1) when the functions of the motor needs to switch, it requires to connect to the external application via the connector, and the function switch of the motor can only be realized by externally inputting a control command. Thus, the assembly is complicate, the use is troublesome, and the reliability is low. 2) The connector is unstably installed on the lead sheath and is easily loose, thereby resulting in hidden danger. 3) The connector has no protective measurements in nonuse state, and the port of the connector is easily polluted or damaged, which may decrease the stability and the safety of the connector in the use state. The same problems also exist in the motor using such a lead sheath assembly.

SUMMARY OF THE INVENTION

In view of the above-described problems, it is one objective of the invention to provide a lead sheath assembly that has a simple structure, easy installation, low production costs, and high reliability.

It is another objective of the invention to provide a motor comprising the lead sheath assembly. The motor has a simple structure, easy installation, low production costs, and high reliability, and is easy to realize function conversion thereof.

To achieve the above objective, in accordance with one embodiment of the invention, there is provided a lead sheath assembly, the assembly comprising: a lead sheath, the lead sheath comprising a cavity; a plurality of external wires; a jumper box, the jumper box comprising: a plurality of through holes, a front end comprising a front interface, and a rear end comprising a rear interface; and a connecting terminal. The external wires are mounted on the lead sheath. The jumper box is disposed in the cavity. The connecting terminal is disposed in the through hole.

In a class of this embodiment, the lead sheath is disposed on an outer surface of the jumper box by injection molding.

In a class of this embodiment, a plurality of baffle plates protrude out of an end part of the jumper box. The baffle plates press an inner side of the lead sheath.

In a class of this embodiment, the external wires are injection molded in the lead sheath. A rear part of each external wire is provided with a conductor terminal.

In a class of this embodiment, necks are disposed on two sides of the lead sheath, respectively.

In a class of this embodiment, a first boss and a second boss are disposed on one end of the lead sheath. The external wires are led out through the first boss. The cavity is disposed in the second boss.

In a class of this embodiment, the lead sheath assembly further comprises a plurality of connectors. Each connector comprises: an insulation casing and a contact piece. Contact pieces of at least one part of the connectors are made of an electrically conductive material.

In accordance with another embodiment of the invention, there is provided a motor comprising the lead sheath assembly, the motor comprising: a motor body, a motor controller, and the lead sheath assembly. The motor body comprises: a housing, a stator assembly, and a rotor assembly. The motor controller comprises: a control box and a control board. The control board comprises: a microprocessor unit MCU, an inverter, and a power supply unit. The assembly comprises: the lead sheath, a plurality of the external wires, the jumper box, and the connecting terminal. The lead sheath comprises the cavity. The jumper box comprises: a plurality of the through holes, and a front end comprising a front interface, and a rear end comprising a rear interface. The stator assembly and the rotor assembly are disposed inside the housing of the motor body. The control board is disposed in the control box. The power supply unit supplies power to each circuit of the control board. The MCU controls the motor body to operate via the inverter. The lead sheath is disposed on the control box and is provided with a plurality of the external wires. The external wires are mounted on the lead sheath. The jumper box is disposed in the cavity. The connecting terminal is disposed in the through hole.

In a class of this embodiment, the connecting terminal is in electric connection to the MCU of the control board via a leading wire in the rear interface.

In a class of this embodiment, the motor further comprises a plurality of the connectors. Each connector comprises: the insulation casing and the contact piece. Contact pieces of at least one part of the connectors are made of the electrically conductive material. Each connector connects an upper connecting terminal to a lower connecting terminal via the front interface and transmits a driving signal to the MCU.

Advantages according to embodiments of the invention are summarized as follows:

1) A plurality of the external wires are disposed on the lead sheath. The lead sheath comprises the cavity, in which the jumper box is disposed. The jumper box comprises a plurality of the through holes. The connecting terminal is disposed in each through hole, and the front interface and the rear interface form on the front end and the rear end of the jumper box, respectively. Thus, the assembly is simple and convenient in installation. The function conversion of the motor can be realized by the jumper box, the operation of which is simple and convenient, the production cost is low and the reliability is high.

2) The lead sheath is disposed on an outer surface of the jumper box by injection molding. The process of the injection molding is simple and is capable of enhancing the installation of the jumper box. A plurality of the baffle plates protrude out of the end part of the jumper box. The baffle plates press the inner side of the lead sheath. Thus, the reliability of the installation of the jumper box is improved, and the jumper box is prevented from dragging out of the lead sheath under the action of an external force, thereby improving the safety factor.

3) The external wires are injection molded in the lead sheath, resulting in simple structure and high reliability. The conductor terminal is arranged on each rear part of the external wire, thereby being convenient for the external wires to connect with external applications.

4) The connector connects the upper connecting terminal with the lower connecting terminal via the front interface. Thus, the function conversion of the motor can be realized by the connector, the assembly is simple, the operation is convenient, and the reliability is high.

5) The motor body comprises: the housing, and the stator assembly and the rotor assembly installed inside the housing. The motor controller comprises: the control box and the control board mounted in the control box. The control board 8 is provided with the microprocessor unit MCU, the inverter, and the power supply unit. The power supply unit supplies power to each circuit of the control board. The MCU controls the operation of the motor body via the inverter. The lead sheath is disposed on the control box. A plurality of the external wires are disposed on the lead sheath. The motor further comprises the jumper box. The lead sheath comprises the cavity, and the jumper box is disposed in the cavity. The jumper box comprises a plurality of the through holes. The connecting terminal is mounted in the through hole. The front interface and the rear interface form at the front end and the rear end of the jumper box, respectively. Thus, the function conversion of the motor is easily realized, and the motor has simple structure, convenient installation, low production costs, and high reliability.

BRIEF DESCRIPTION OF THE DRAWINGS

The invention is described hereinbelow with reference to the accompanying drawings, in which.

DETAILED DESCRIPTION OF THE EMBODIMENTS

Figure 1:
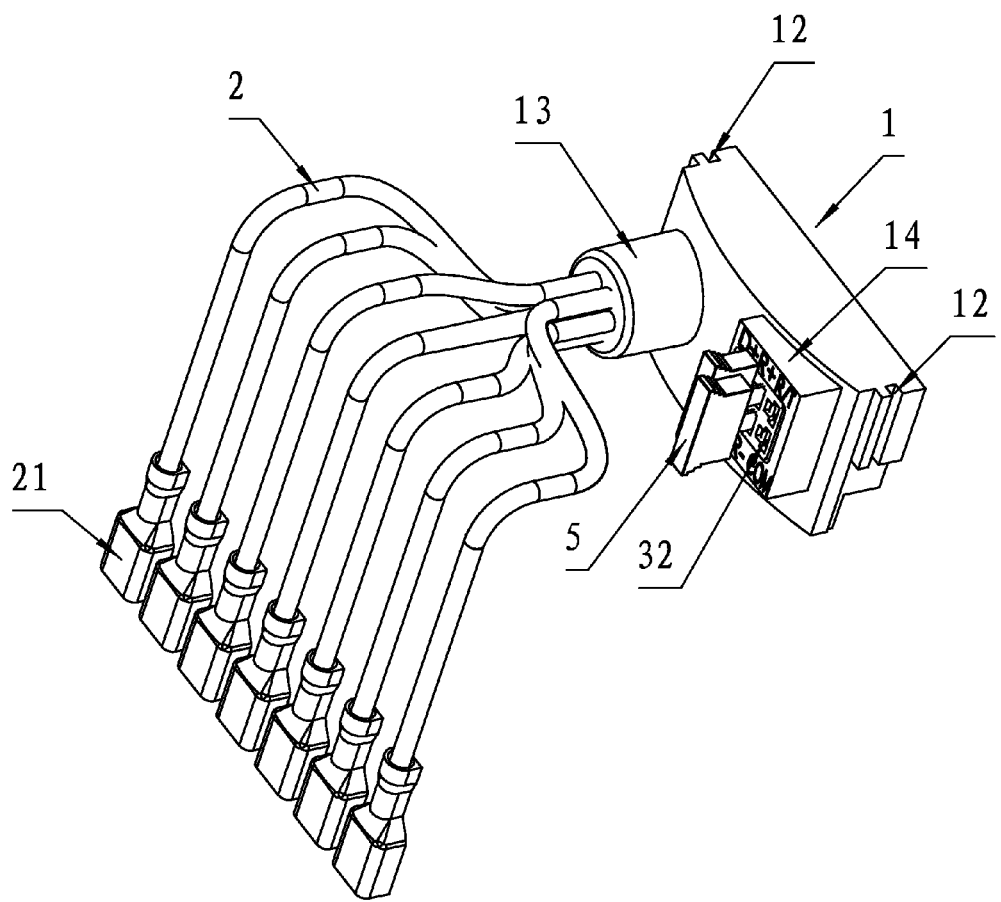
FIG. 1 is a first stereogram of a lead sheath assembly according to one embodiment of the invention.
Figure 2:
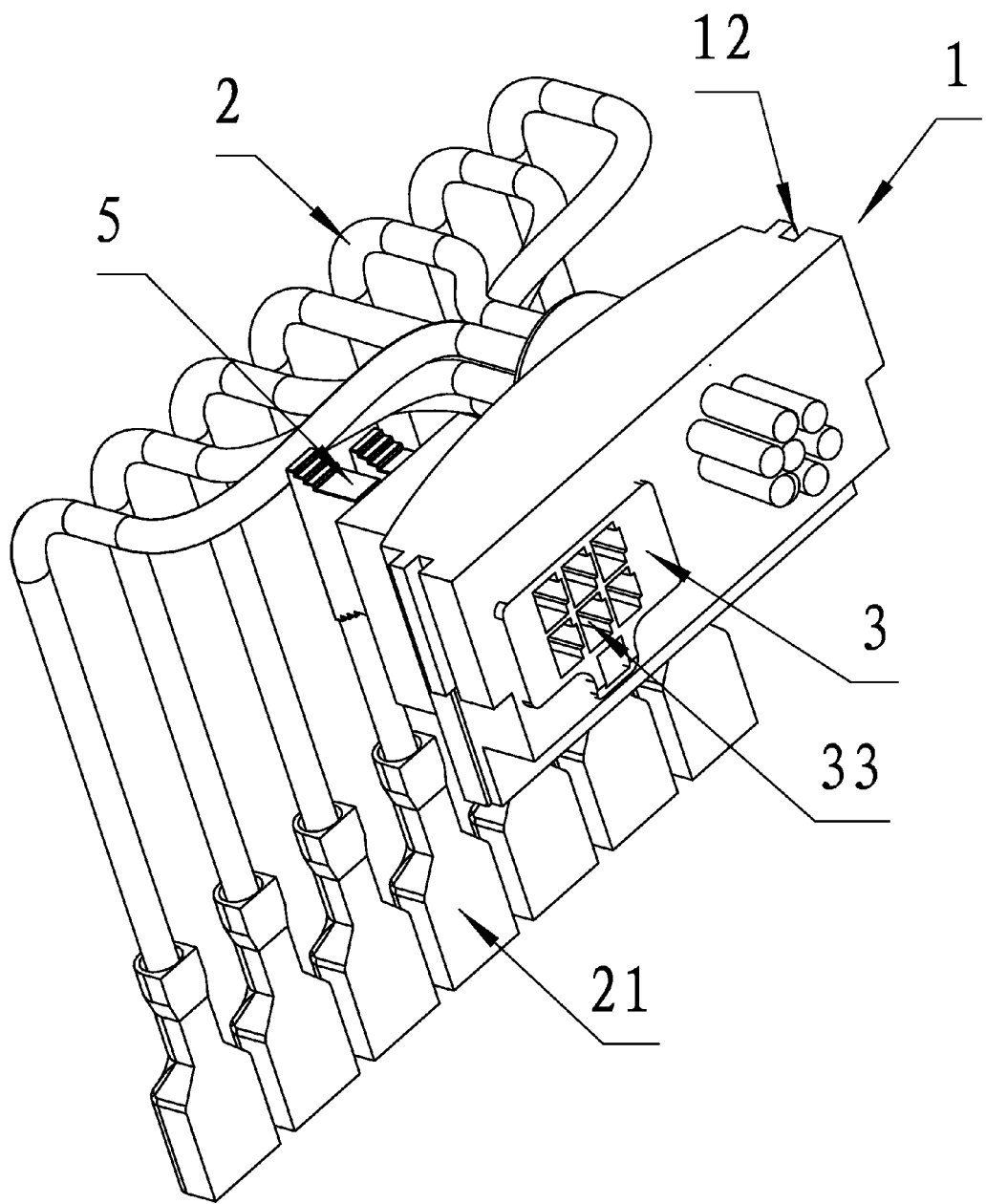
FIG. 2 is a second stereogram of a lead sheath assembly according to one embodiment of the invention.
Figure 3:
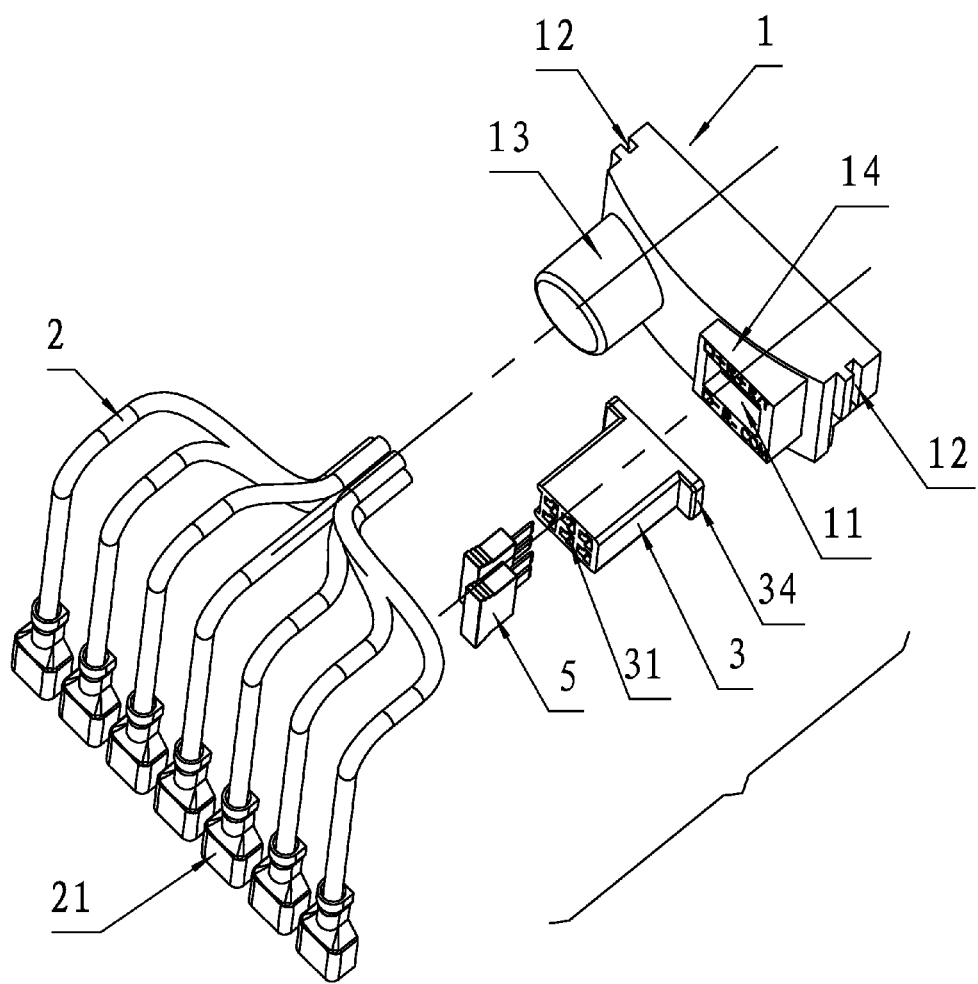
FIG. 3 is an exploded view of a lead sheath assembly according to one embodiment of the invention.
Figure 4:
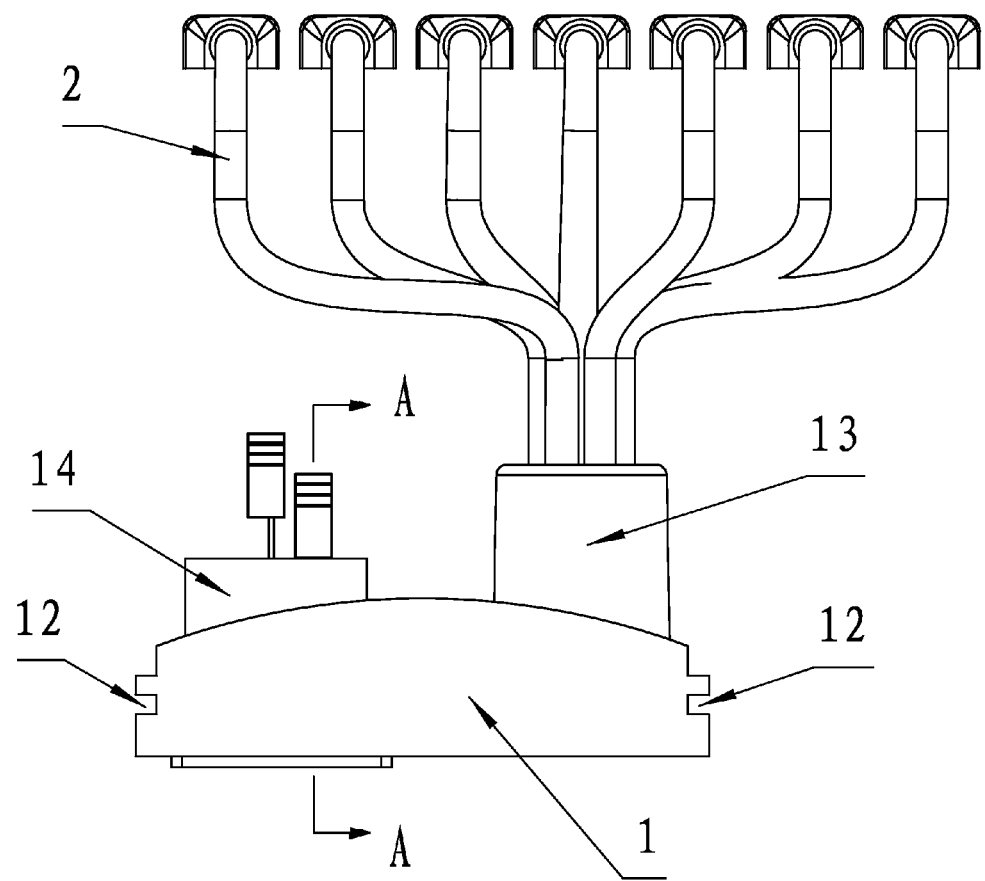
FIG. 4 is a top view of a lead sheath assembly according to one embodiment of the invention.
Figure 5:
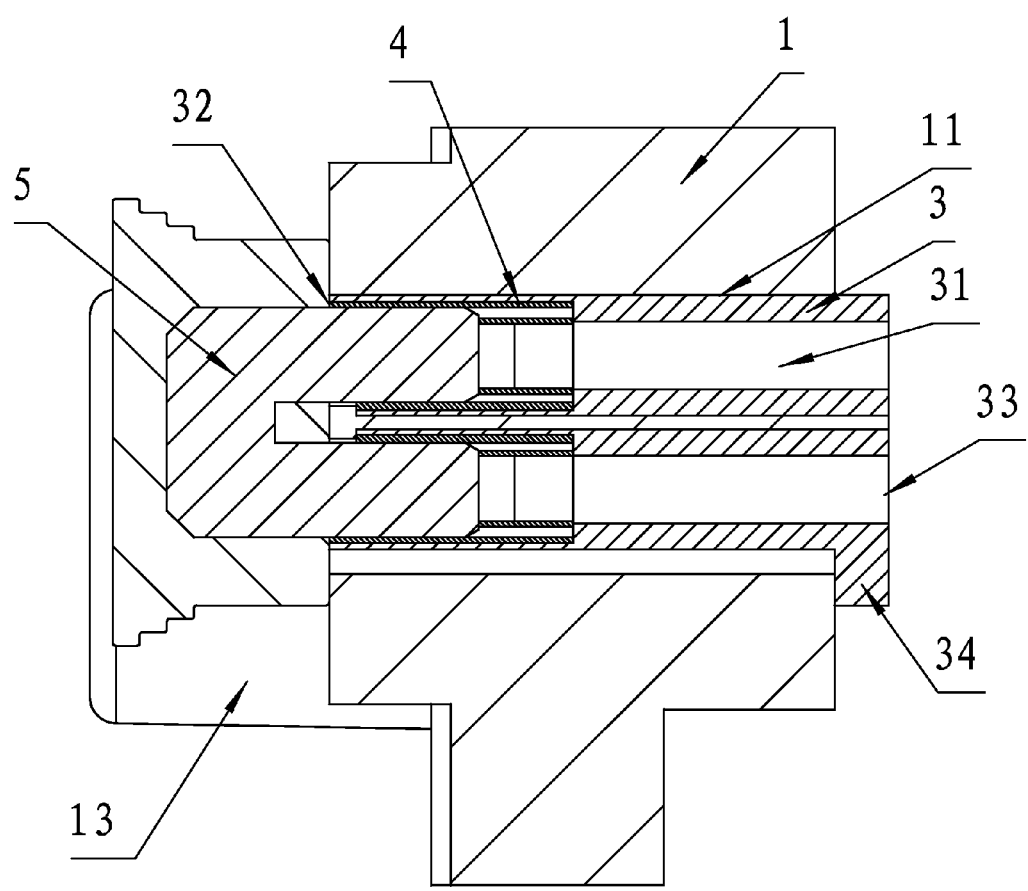
FIG. 5 is a cross sectional view taken from line A-A of FIG. 4.
Figure 6:
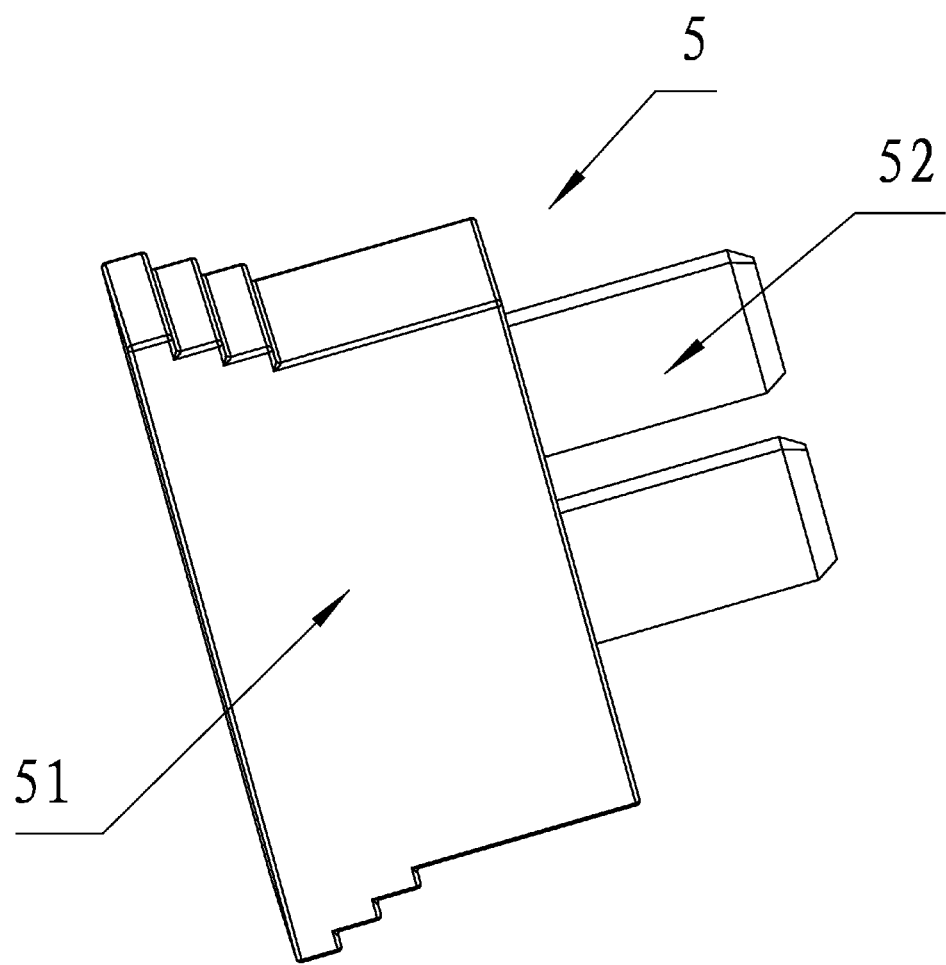
FIG. 6 is a stereogram of a connector according to one embodiment of the invention.
Figure 7:
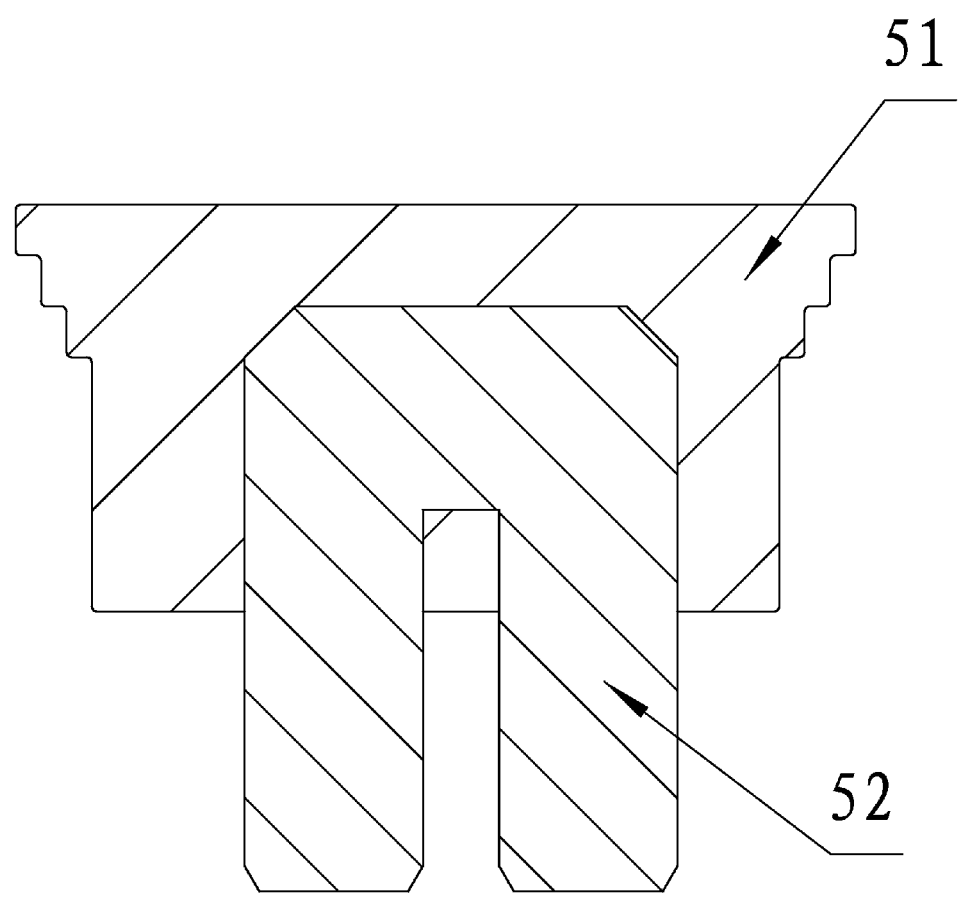
FIG. 7 is a section view of a connector according to one embodiment of the invention.

For further illustrating the invention, experiments detailing a lead sheath assembly and a motor comprising the same are described below. It should be noted that the following examples are intended to describe and not to limit the invention.

Example 1

As shown in FIGS. 1-7, a lead sheath assembly comprises a lead sheath 1. A plurality of external wires 2 are disposed on the lead sheath 1. The lead sheath assembly further comprises a jumper box 3. The lead sheath 1 comprises a cavity 11, and the jumper box 3 is disposed in the cavity 11. The jumper box 3 comprises a plurality of through holes 31. A connecting terminal 4 is disposed in each through hole 31. A front interface 32 and a rear interface 33 form at a front end and a rear end of the jumper box 3, respectively.

The lead sheath 1 is disposed on an outer surface of the jumper box 3 by injection molding.

A plurality of baffle plates 34 protrude out of an end part of the jumper box 3. The baffle plates 34 press an inner side of the lead sheath 1.

The external wires 2 are injection molded in the lead sheath 1, and a rear part of each external wire 2 is provided with a conductor terminal 21.

Necks 12 are disposed on two sides of the lead sheath 1, respectively.

A first boss 13 and a second boss 14 are disposed on one end of the lead sheath 1. The external wires 2 are led out through the first boss 13. The cavity 11 is disposed in the second boss 14.

Each connector 5 connects an upper connecting terminal 4 to a lower connecting terminal via the front interface 32. Each connector 5 comprises: an insulating covering 51 and a contact piece 52. Contact pieces 52 of one part of the connectors 5 are made of an insulating material, and contact pieces 52 the other part of the connector 5 are made of an electrically conductive material.

Principal of the lead sheath assembly is as follows: the jumper box 3 is disposed in the cavity 11 of the lead sheath 1. The connecting terminal 4 is disposed in the through hole 31 of the jumper box 3, and the front interface 32 and the rear interface 33 form at the front end and the rear end of the jumper box 3, respectively. The connecting terminal 4 is in electric connection to the MCU of the control board 8 via a leading wire in the rear interface 33. The upper connecting terminal 4 and the lower connecting terminal 4 are connected by the connector for realizing the function conversion of the motor. Thus, the lead sheath assembly is simplified and has convenience in installation, low production costs, and high reliability.

Example 2

Figure 8:
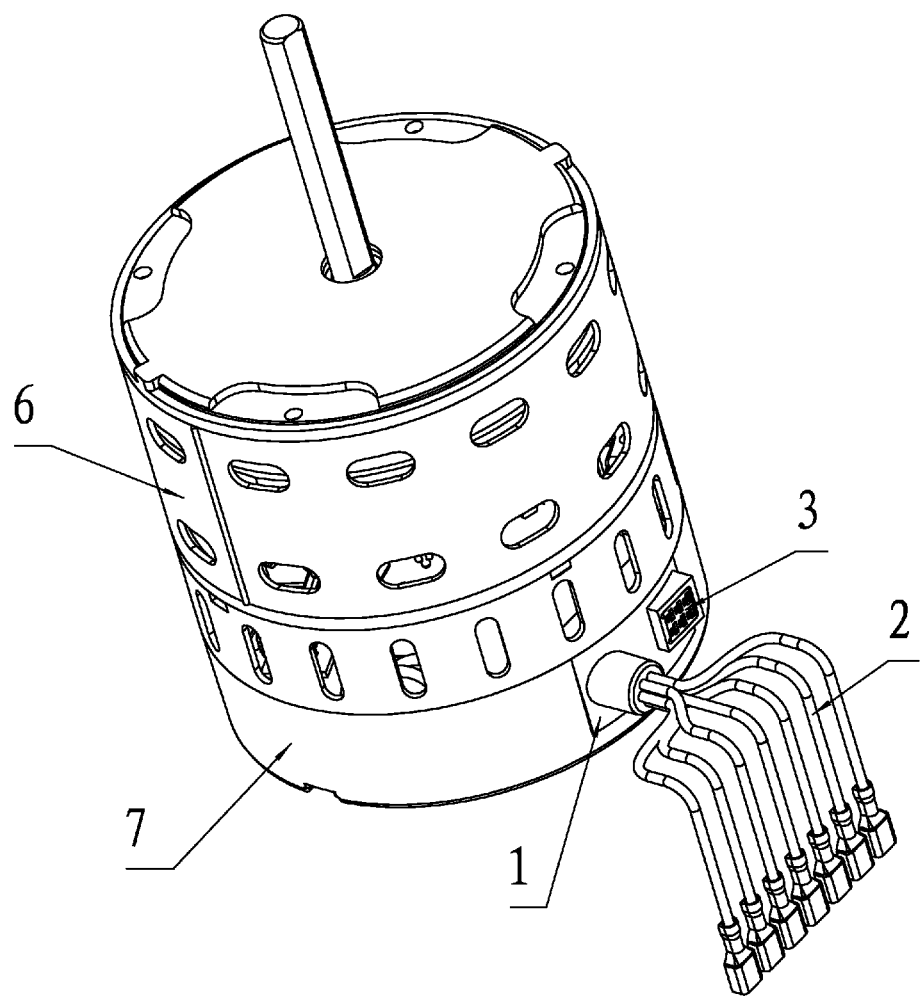
FIG. 8 is a stereogram of a motor comprising a lead sheath according to one embodiment of the invention.
Figure 9:
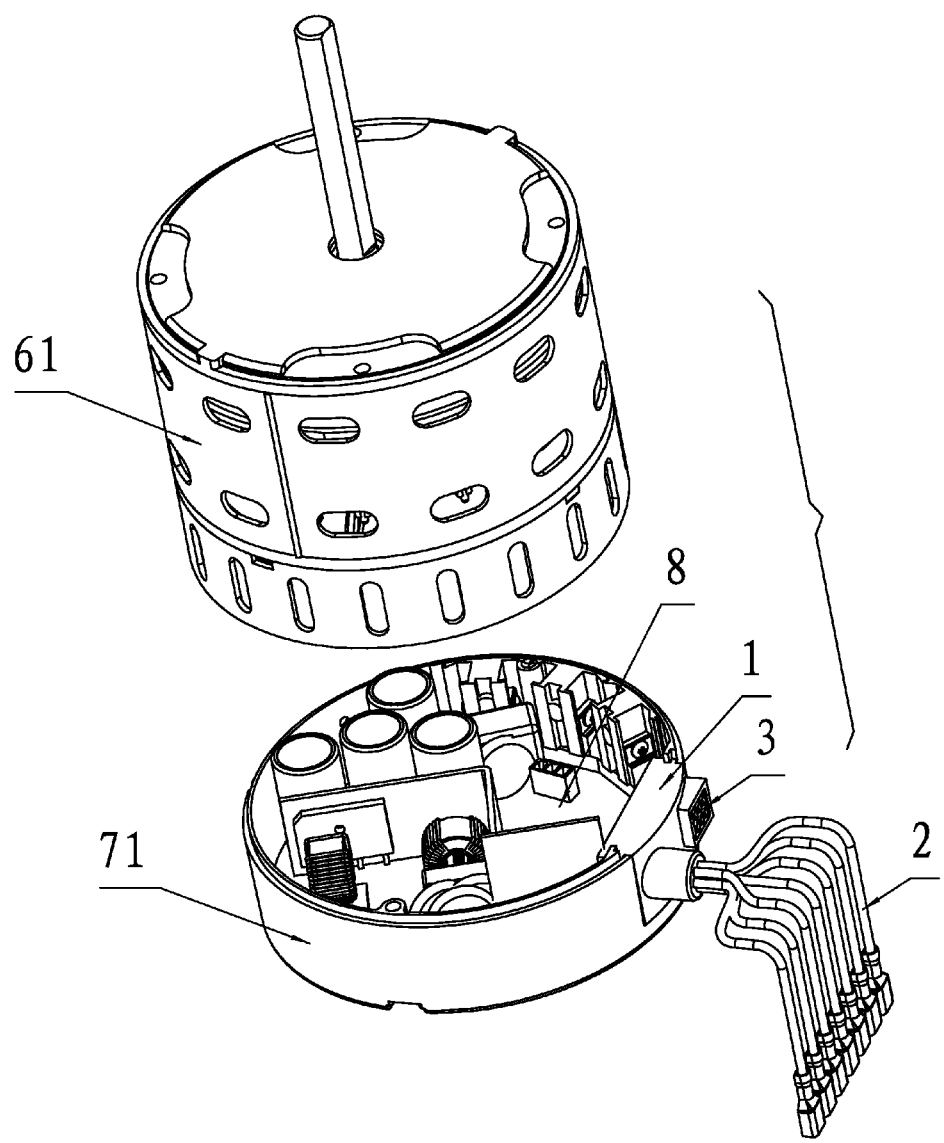
FIG. 9 is an exploded view of a motor comprising a lead sheath according to one embodiment of the invention.
Figure 10:
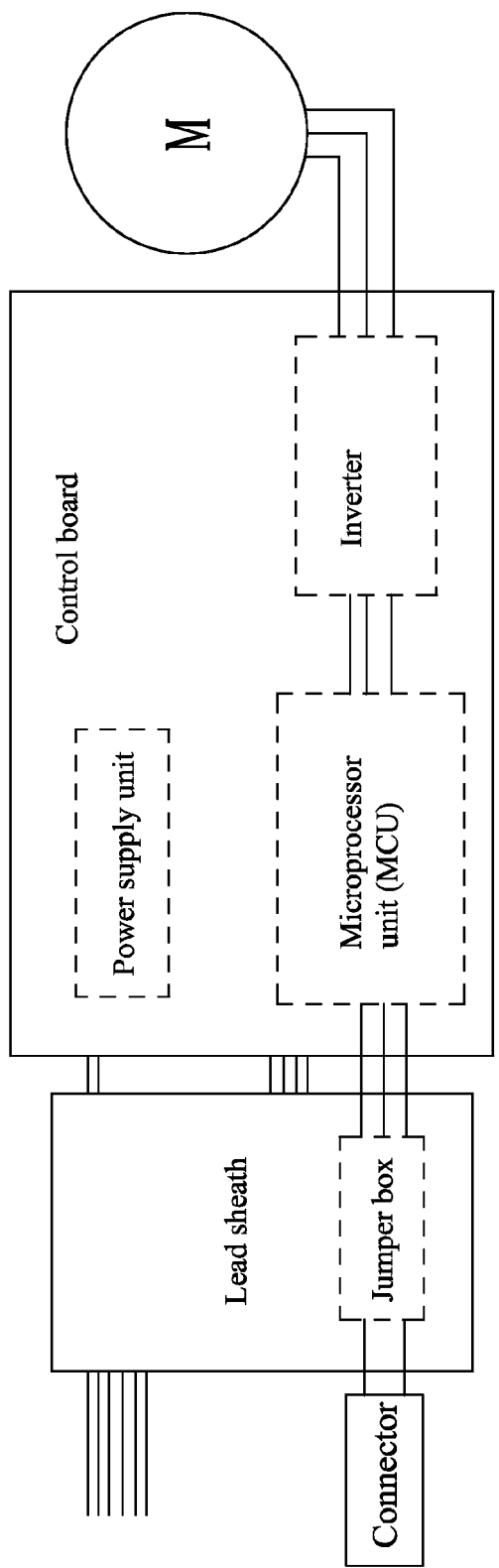
FIG. 10 is a schematic circuit diagram of a motor comprising a lead sheath according to one embodiment of the invention.

As shown in FIGS. 8-10, a motor comprises: a motor body 6 and a motor controller 7. The motor body 6 comprises: a housing 61, and a stator assembly and a rotor assembly installed inside the housing 61. The motor controller 7 comprises: a control box 71 and a control board 8 mounted in the control box 71. The control board 8 is provided with a microprocessor unit MCU, an inverter, and a power supply unit. The power supply unit supplies power to each circuit of the control board 8. The MCU controls the operation of the motor body via the inverter. A lead sheath is disposed on the control box 71. A plurality of external wires 2 are disposed on the lead sheath 1. The motor further comprises a jumper box 3. The lead sheath 1 comprises a cavity 11, and the jumper box 3 is disposed in the cavity 11. The jumper box 3 comprises a plurality of through holes 31. A connecting terminal 4 is mounted in the through hole 31. A front interface 32 and a rear interface 33 form at a front end and a rear end of the jumper box 3, respectively.

The connecting terminal 4 is in electric connection to the MCU of the control board 8 via a leading wire in the rear interface 33.

A plurality of external wires pass through the lead sheath 1 and are in electric connection with the power supply unit and the MCU of the control board.

Each connector 5 comprises: an insulating covering 51 and a contact piece 52. Contact pieces 52 of one part of the connectors 5 are made of an insulating material, and contact pieces 52 of the other part of the connectors 5 are made of an electrically conductive material. Each connector 5 connects an upper connecting terminal 4 to a lower connecting terminal 4 via the front interface 32 and transmits a driving signal to the MCU for processing. When the motor is in the nonuse state, the connector 5 comprising the contact piece 52 made of the insulating material is mounted in the front interface 32.

Principle of the motor according to embodiments of the invention is as follows: the lead sheath 1 is mounted on the control box 71 of the motor. A plurality of the external wires 2 are disposed on the lead sheath 1. The jumper box 3 is disposed inside the cavity 11 of the lead sheath 1. The connecting terminal 4 is disposed in through holes 31 of the jumper box 3, and the front interface 32 and the rear interface 33 form at the front end and the rear end of the jumper box 3, respectively. The rear interface 33 connects the connecting terminal 4 to the MCU of the control board 8 via the leading wire. The upper connecting terminal 4 and the lower connecting terminal 4 are connected via the connector 5. Thus, the function conversion of the motor is realized, and the motor has simple structure, convenient installation, low production costs, and high reliability.

While particular embodiments of the invention have been shown and described, it will be obvious to those skilled in the art that changes and modifications may be made without departing from the invention in its broader aspects, and therefore, the aim in the appended claims is to cover all such changes and modifications as fall within the true spirit and scope of the invention.

The invention claimed is:

1. A motor comprising:
   a) a motor body, the motor body comprising: a housing, a stator assembly, and a rotor assembly;
   b) a motor controller, the motor controller comprising: a control box and a control board; the control board comprising: a microprocessor unit (MCU), an inverter, and a power supply unit; and
   c) a lead sheath assembly, the lead sheath assembly comprising: a lead sheath, a plurality of external wires, and a jumper box; the lead sheath comprising a cavity; the jumper box comprising: a plurality of through holes, a front end comprising a front interface, and a rear end comprising a rear interface; wherein:
   the stator assembly and the rotor assembly are disposed inside the housing of the motor body;
   the control board is disposed in the control box;
   the power supply unit supplies power to each circuit of the control board;
   the MCU controls the motor body to operate via the inverter;
   the lead sheath is disposed on the control box;
   the plurality of external wires is mounted on the lead sheath;
   the jumper box is disposed in the cavity; and
   a connecting terminal is disposed in each of the plurality of through holes.

2. The motor of claim 1, wherein the connecting terminal is in electric connection to the MCU of the control board via a leading wire in the rear interface.

3. The motor of claim 1, further comprising a plurality of connectors; wherein
   each connector comprises: an insulation casing and the contact a contact piece;
   contact pieces of at least one part of the plurality of connectors are made of the electrically conductive material; and
   each connector connects an upper connecting terminal to a lower connecting terminal via the front interface and transmits a driving signal to the MCU.

* * * * *